United States Patent
Horikoshi

(10) Patent No.: US 8,381,149 B2
(45) Date of Patent: Feb. 19, 2013

(54) TIMING ANALYSIS APPARATUS, TIMING ANALYSIS METHOD, AND TIMING ANALYSIS PROGRAM

(75) Inventor: Yoshitaka Horikoshi, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 308 days.

(21) Appl. No.: 12/923,887

(22) Filed: Oct. 13, 2010

(65) Prior Publication Data
US 2011/0107285 A1    May 5, 2011

(30) Foreign Application Priority Data
Oct. 29, 2009 (JP) .................... 2009-249445

(51) Int. Cl.
*G06F 17/50* (2006.01)
(52) U.S. Cl. .................... 716/108
(58) Field of Classification Search .......... 716/108
See application file for complete search history.

(56) References Cited

U.S. PATENT DOCUMENTS

| | | | |
|---|---|---|---|
| 7,392,495 B1* | 6/2008 | Cherukupalli et al. | 716/114 |
| 7,526,399 B2 | 4/2009 | Matsumoto et al. | |
| 7,801,718 B2* | 9/2010 | Reddy et al. | 703/14 |
| 8,239,795 B2* | 8/2012 | Ono | 716/108 |
| 2005/0050499 A1 | 3/2005 | Matsumoto et al. | |

FOREIGN PATENT DOCUMENTS

JP    2005-100310 A    4/2005

* cited by examiner

*Primary Examiner* — Jack Chiang
*Assistant Examiner* — Brandon Bowers
(74) *Attorney, Agent, or Firm* — McGinn IP Law Group, PLLC

(57) ABSTRACT

A timing analysis apparatus includes a circuit data acquisition section for acquiring circuit data; a path setup section for setting up two paths extending from a clock source to a clock supply destination as a first path and a second path in accordance with the circuit data; a distance calculation section for calculating a coupling point-to-point distance between a first output terminal of the mesh section on the first path and a second output terminal of the mesh section on the second path; a global coefficient decision section for determining, in accordance with the coupling point-to-point distance, a global coefficient that indicates the degree of variation in time period from the moment when a clock signal is issued from the clock source until the moment when the clock signal reaches each output terminal of the mesh section; and a timing verification section for verifying clock supply timing on each of the first path and the second path in accordance with the global coefficient.

13 Claims, 9 Drawing Sheets

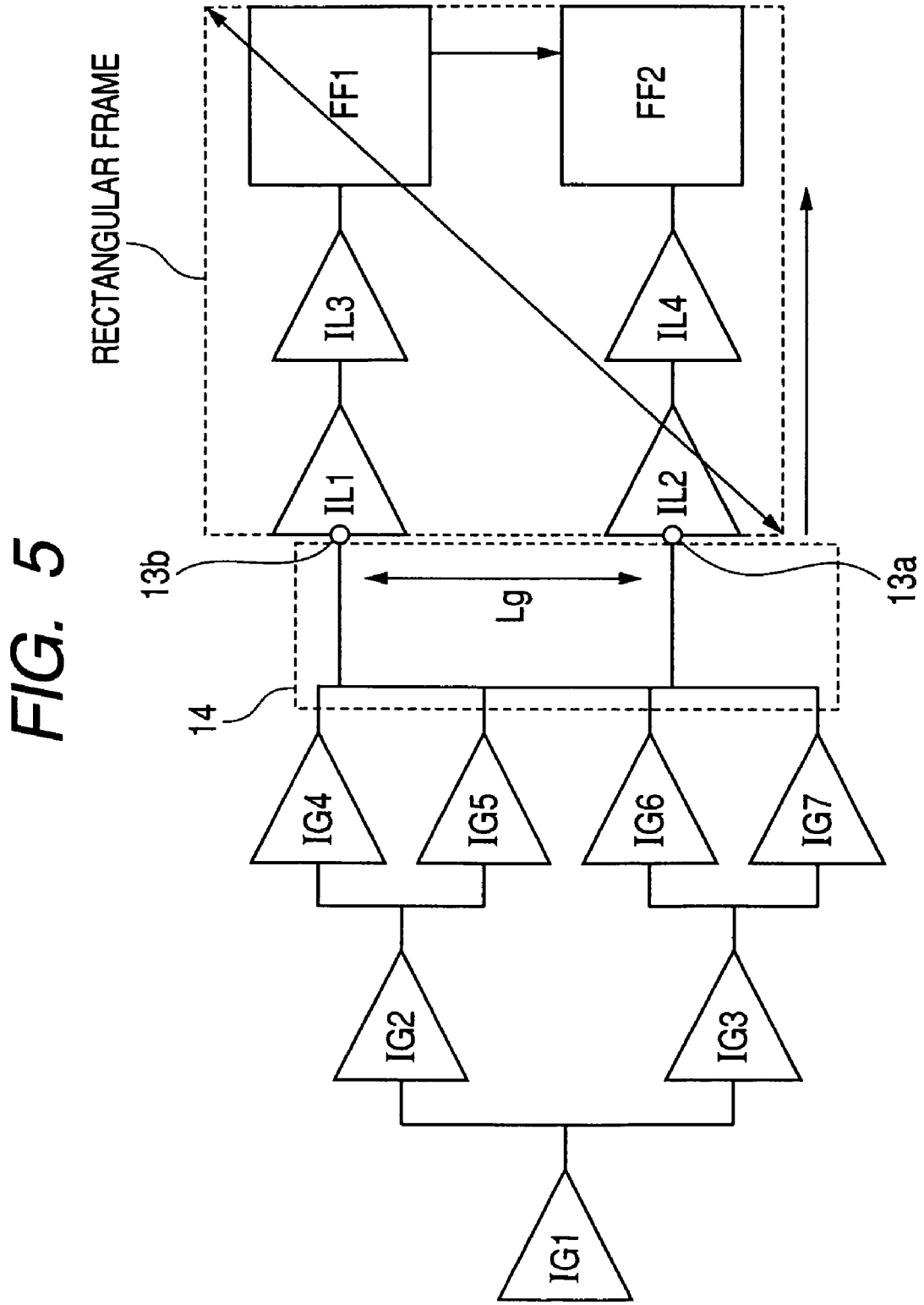

FIG. 6

COEFFICIENT LIBRARY
4

LOCAL COEFFICIENT LIBRARY

| DISTANCE | LOCAL COEFFICIENT |
|---|---|
| DIAGONAL DISTANCE 1 | $\alpha_{1\text{-}1}$ |
| DIAGONAL DISTANCE 2 | $\alpha_{1\text{-}2}$ |
| DIAGONAL DISTANCE 3 | $\alpha_{1\text{-}3}$ |
| ... | ... |

GLOBAL COEFFICIENT LIBRARY

| COUPLING POINT-TO-POINT DISTANCE | NUMBER OF STAGES | GLOBAL COEFFICIENT |
|---|---|---|
| $L_1$ | 1 | $\alpha_{g1\text{-}1}$ |
|  | 2 | $\alpha_{g1\text{-}2}$ |
|  | 3 | $\alpha_{g1\text{-}3}$ |
|  | ... | ... |
| $L_2$ | 1 | $\alpha_{g2\text{-}1}$ |
|  | 2 | $\alpha_{g2\text{-}2}$ |
|  | 3 | $\alpha_{g2\text{-}3}$ |
|  | ... | ... |
| ... |  |  |

FIG. 7

GLOBAL DELAY INFORMATION

| POSITION | REFERENCE VALUE $T_{gs}$ |
|---|---|
| OUTPUT TERMINAL 1 | $T_{gs\text{-}1}$ |
| OUTPUT TERMINAL 2 | $T_{gs\text{-}2}$ |
| OUTPUT TERMINAL 3 | $T_{gs\text{-}3}$ |
| ... | ... |

LOCAL DELAY INFORMATION

| DISTANCE | NUMBER OF STAGES | REFERENCE VALUE $T_{ls}$ |
|---|---|---|
| L-1 | 1 | $T_{ls}$ |
| | 2 | $T_{ls}$ |
| ... | ... | ... |
| | ... | ... |
| L-n | 1 | $T_{ls}$ |
| | 2 ... | ... |
| ... | ... | ... |

3 — DELAY INFORMATION STORAGE SECTION

TIMING ANALYSIS APPARATUS, TIMING ANALYSIS METHOD, AND TIMING ANALYSIS PROGRAM

CROSS-REFERENCE TO RELATED APPLICATIONS

The disclosure of Japanese Patent Application No. 2009-249445 filed on Oct. 29, 2009 including the specification, drawings and abstract is incorporated herein by reference in its entirety.

BACKGROUND OF THE INVENTION

The present invention relates to a timing analysis apparatus, a timing analysis method, and a timing analysis program.

In common applications of an integrated circuit, a clock signal is generated by a clock source (root), and then the clock signal is fed therefrom to a clock supply destination device through a predetermined path.

Referring to FIG. 1, there is shown a schematic diagram of an example of an integrated circuit. The exemplary integrated circuit shown in FIG. 1 includes a plurality of drivers (I1 to I7) and a plurality of clock supply destination devices (a to d) (each of which is hereinafter referred to just as a clock supply destination wherever appropriate). The driver I1 is provided as a clock source for generating a clock signal. The drivers I2 and I3 are coupled at a stage subordinate to the clock source I1. At a stage subordinate to the driver I2, the drivers I4 and I5 are coupled. Likewise, at a stage subordinate to the driver I3, the drivers I6 and I7 are coupled. Further, the clock supply destination device a is coupled at a stage subordinate to the driver I4, the clock supply destination device b is coupled at a stage subordinate to the driver I5, the clock supply destination device c is coupled at a stage subordinate to the driver I6, and the clock supply destination device d is coupled at a stage subordinate to the driver I7.

In the integrated circuit shown in FIG. 1, the clock signal generated by the clock source I1 is fed therefrom to each clock supply destination device (a to d) through a predetermined path. For example, the clock signal is fed from the clock source I1 to the clock supply destination device a through the drivers I2 and I4.

It takes a certain period of time for the clock signal to reach each clock supply destination device. This period of time required for clock signal propagation to each clock supply destination device is referred to as a delay time. In a case where two paths are provided in an integrated circuit, a malfunction may occur therein if there is a significant difference in delay time between the two paths. The difference in delay time is referred to as clock skew. To prevent occurrence of a malfunction such as mentioned above in an integrated circuit, the degree of clock skew is estimated in design review thereof. Then, a margin is set up in circuit design according to the degree of clock skew estimated, and an operating frequency and other performance characteristics of the integrated circuit are determined based on the margin thus set up. Alternatively, the integrated circuit is redesigned according to the result of clock skew verification.

The degree of clock skew can be determined by calculating a value of difference in delay time between the two paths concerned. Where the two paths are branchingly provided via a branch point, a delay time length in clock signal propagation from the clock source concerned to the branch point is the same on the two paths. Hence, regarding each path, a delay time in clock signal propagation from the branch point to each clock supply destination is determined. Then, in comparison between the two paths, the difference in delay time in clock signal propagation posterior to the branch point is determined as a value representing the degree of clock skew between the two paths. More specifically, delay time calculation is performed based on such factors as path routing from the branch point to each clock supply destination and the number of drivers disposed between the branch point and each clock supply destination.

In Patent Document 1 (Japanese Unexamined Patent Publication No. 2005-100310), there is disclosed a conventional technique related to the present invention, i.e., a delay time calculation method for calculating a delay time on a path in an integrated circuit. According to the delay time calculation method disclosed in the Patent Document 1, the degree of relative variation in delay time between comparative paths is separated into systematic components and random components, and delay time calculation is carried out by using the systematic components and random components thus separated.

RELATED ART REFERENCE

Patent Document

Patent Document 1:
Japanese Unexamined Patent Publication No. 2005-100310

SUMMARY OF THE INVENTION

For reduction in clock skew, there is provided a mesh section in some integrated circuit arrangements. The mesh section is a circuit portion that has clock signal supply wiring disposed in a meshed form. At least one bus wiring is included in the mesh section. Output wiring lines of a plurality of drivers are coupled in common to the same bus wiring.

Referring to FIG. 2, there is shown a schematic diagram of an example of an integrated circuit provided with a mesh section. The exemplary integrated circuit shown in FIG. 2 comprises a clock source I1, a plurality of drivers I2 to I7, a mesh section, and a plurality of clock supply destinations a to d. The mesh section is coupled at a stage subordinate to the drivers I4 to I7. Through the mesh section, a clock signal is fed to each of the clock supply destinations a to d.

The mesh section is fed with a clock signal from each of the drivers I4 to I7. Thus, even if there are differences in clock signal arrival time among the drivers I4 to I7, the differences are subjected to equalization in the mesh section. Resultantly, among the clock supply destinations a to d, uniformity in clock signal arrival time can be provided for reduction in clock skew.

However, in a case where such a mesh section is provided, it is rather difficult to accurately define a branch point of the two paths concerned.

It is assumed here that the clock source I1 is defined as a branch point of the two paths concerned. Under this condition, the effect of clock skew reduction through the mesh section is not reflected in the result of clock skew calculation at all. Even if clock skew is suppressed adequately in intrinsic terms, an overrated false value of clock skew may be estimated erroneously. In consequence, an unnecessarily redundant margin is set up in circuit design, thereby causing increases in chip size and engineering cost.

Alternatively, it is assumed here that the mesh section is defined as a branch point of the two paths concerned, i.e., no delay time is assumed on the two paths from the clock source to the mesh section. Under this condition, an underrated false value of clock skew may be estimated erroneously since the degree of variation in clock signal delay time is not zero even between two different points in the mesh section. It is to be noted that, even in the mesh section, a certain magnitude of systematic variation in delay time occurs between two different points therein depending on such factors as voltage fluctuation, in-plane gradient, and pattern configuration characteristics. Hence, the degree of clock skew is underestimated to give rise to the possibility of a malfunction in the integrated circuit concerned.

As mentioned above, in a case where a mesh section is provided, there occurs a problem in that the degree of clock skew between the two paths concerned cannot be estimated accurately.

In carrying out the present invention and according to one aspect thereof, there is provided a timing analysis apparatus including: a circuit data acquisition section for acquiring circuit data regarding a circuit under analysis; the circuit under analysis being arranged to include a clock source, a mesh section that is coupled to the clock source and configured with wiring in a meshed form, and a clock supply destination that receives a clock signal from the clock source via the mesh section; a path setup section for setting up two paths extending from the clock source to the clock supply destination as a first path and a second path in accordance with the circuit data; a distance calculation section for calculating a coupling point-to-point distance between a first output terminal of the mesh section on the first path and a second output terminal of the mesh section on the second path; a global coefficient decision section for determining a global coefficient that indicates the degree of variation in clock signal delay time at each output terminal of the mesh section; a global delay time calculation section for calculating a delay time in clock signal propagation from the clock source to the first output terminal and a delay time in clock signal propagation from the clock source to the second output terminal as a first global delay time and a second global delay time respectively in accordance with the global coefficient; and a timing verification section for verifying clock supply timing on each of the first path and the second path in accordance with the first global delay time and the second global delay time.

According to research findings by the present inventors, the degree of variation in clock signal delay time between two points in a mesh section depends on the distance between the two points therein. Hence, by determining a global coefficient in accordance with a coupling point-to-point distance as mentioned above, it is possible to accurately estimate the degree of clock skew in a circuit provided with a mesh section.

Further, according to another aspect of the present invention, there is provided a timing analysis method including the steps of: acquiring circuit data regarding a circuit under analysis through computer operation; the circuit under analysis being arranged to include a clock source, a mesh section that is coupled to the clock source and configured with wiring in a meshed form, and a clock supply destination that receives a clock signal from the clock source via the mesh section; setting up two paths extending from the clock source to the clock supply destination as a first path and a second path in accordance with the circuit data through computer operation; calculating a coupling point-to-point distance between a first output terminal of the mesh section on the first path and a second output terminal of the mesh section on the second path through computer operation; determining, in accordance with the coupling point-to-point distance through computer operation, a global coefficient that indicates the degree of variation in clock signal delay time at each output terminal of the mesh section; calculating a delay time in clock signal propagation from the clock source to the first output terminal and a delay time in clock signal propagation from the clock source to the second output terminal as a first global delay time and a second global delay time respectively in accordance with the global coefficient through computer operation; and verifying clock supply timing on each of the first path and the second path in accordance with the first global delay time and the second global delay time.

Still further, according to another aspect of the present invention, there is provided a timing analysis program for implementing the above-mentioned timing analysis method through computer operation.

As described above and according to the present invention, it is possible to provide a timing analysis apparatus, a timing analysis method, and a timing analysis program that enable accurate estimation of the degree of clock skew.

BRIEF DESCRIPTION OF THE DRAWINGS

FIG. 5 is a schematic diagram showing an example of a circuit under analysis;

FIG. 6 is a conceptual diagram showing data stored in a coefficient library;

FIG. 7 is a conceptual diagram showing data stored in a delay information storage section;

DETAILED DESCRIPTION OF THE PREFERRED EMBODIMENTS

The present invention will now be described in detail by way of example with reference to the accompanying drawings.

First, the following describes the outline of a preferred embodiment of the present invention.

Figure 1:
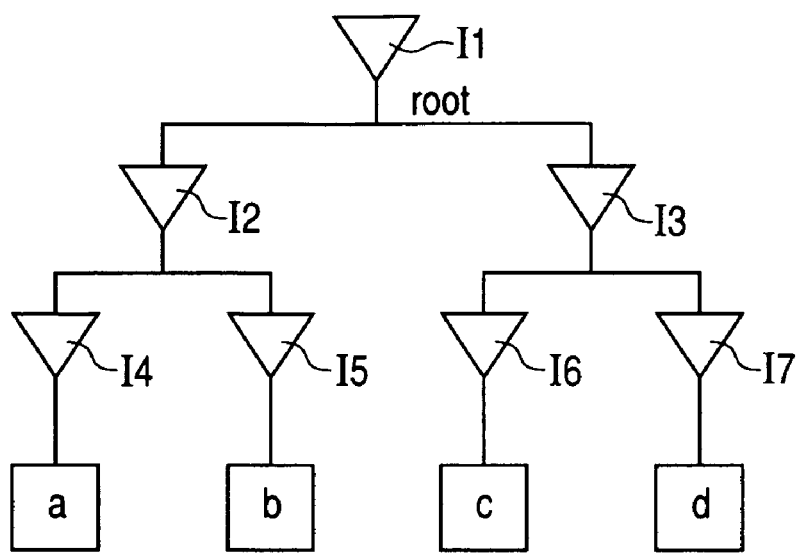
FIG. 1 is a schematic diagram showing an example of an integrated circuit.
Figure 2:
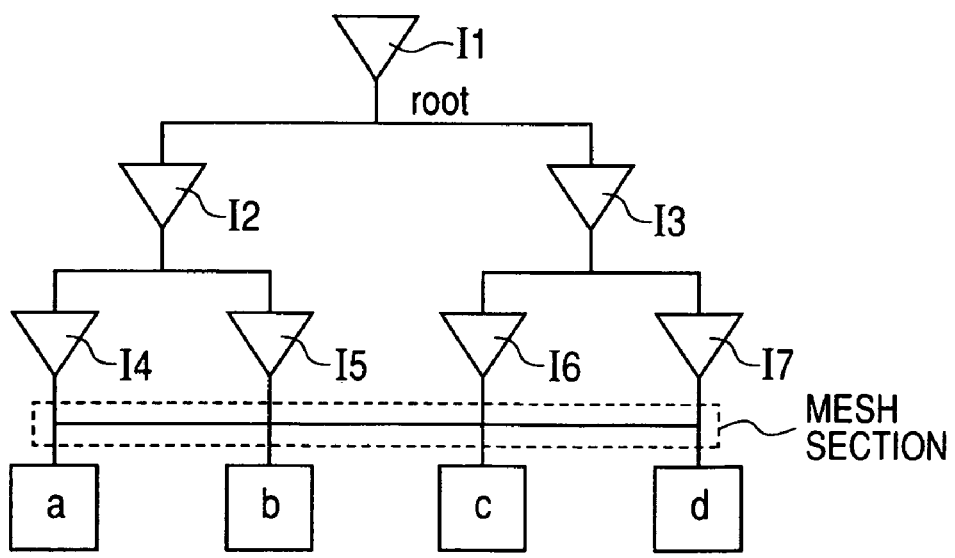
FIG. 2 is a schematic diagram showing an example of an integrated circuit provided with a mesh section.
Figure 3:
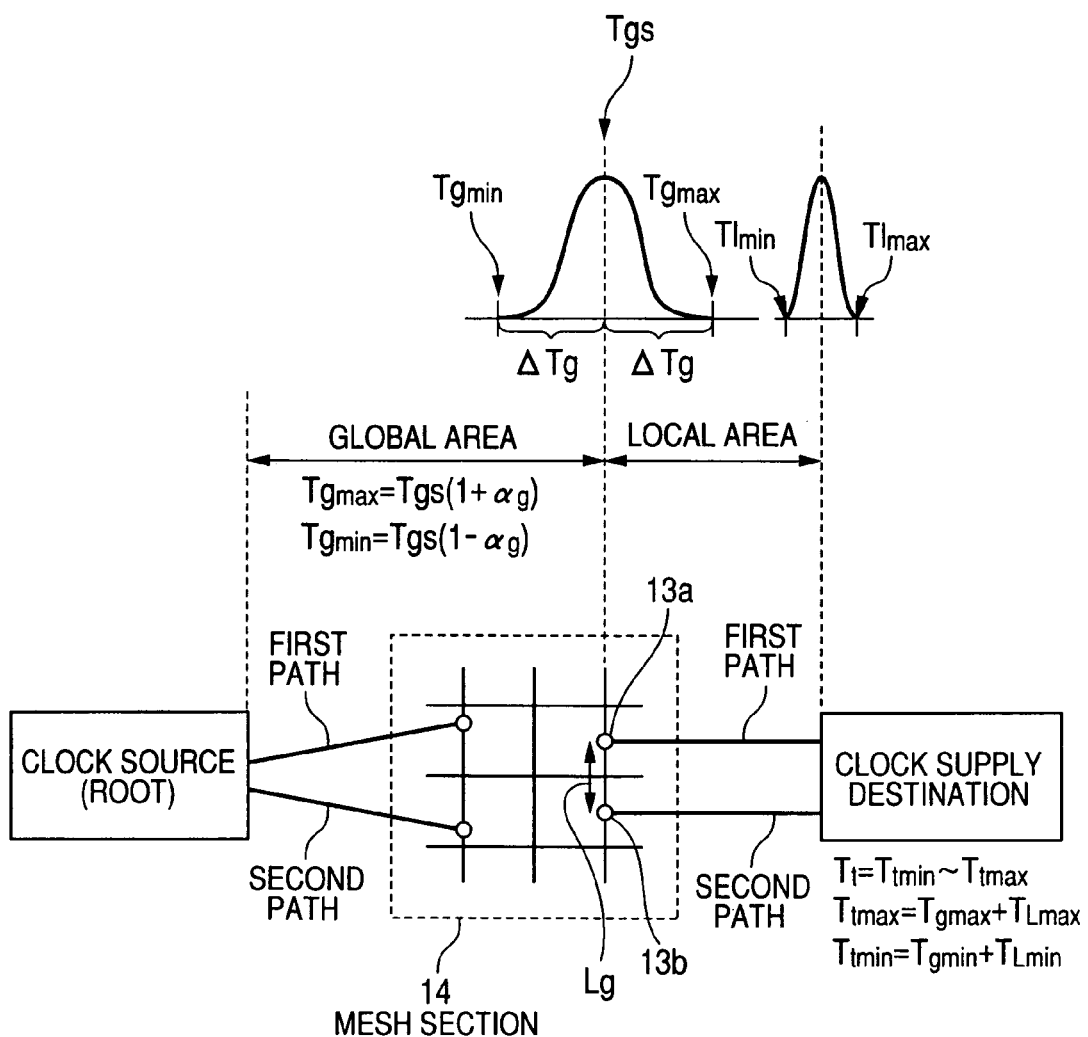
FIG. 3 is a schematic diagram showing the outline of a preferred embodiment of the present invention.

Referring to FIG. 3, there is shown a schematic diagram of the outline of the preferred embodiment of the present invention. A circuit under timing analysis illustrated in FIG. 3 includes a clock source (route), a mesh section 14, and a clock supply destination. Via the mesh section 14, the clock supply destination is coupled to the clock source. A clock signal is supplied from the clock source to the clock destination via the mesh section 14. It is assumed here that, as clock signal propagation lines to be subjected to timing analysis, two paths (first path and second path) from the clock source to the clock supply destination are set up.

With respect to the two paths, the degree of clock skew can be determined according to the difference between a delay time on one path and a delay time on the other path. It is to be noted, however, that a delay time on each path varies in the vicinity of a reference value level. That is, a delay time on each path Tt has a range of variation from a minimum value Ttmin to a maximum value Ttmax. Hence, in precise terms, the degree of clock skew is estimated based on the maximum value Ttmax of delay time on one path and the minimum value Ttmin of delay time on the other path.

In the circuit under timing analysis, a region ranging from the clock source to each output terminal 13 of the mesh section 14 is defined as a global area, and a region ranging from each output terminal 13 of the mesh section 14 to the clock supply destination is defined as a local area. A delay time on each path varies in the vicinity of a reference value in each of the global and local areas. That is, a delay time on each path in the global area has a range of variation from a minimum value Tgmin to a maximum value Tgmax. Likewise, a delay time on each path in the local area has a range of variation from a minimum value Tlmin to a maximum value Tlmax. The maximum value Ttmax of delay time on each path can be regarded as the sum of the maximum value Tgmax in the global area and the maximum value Tlmax in the local area. The minimum value Ttmin of delay time on each path can be regarded as the sum of the minimum value Tgmin in the global area and the minimum value Tlmin in the local area.

Here, particular consideration is given to a delay time in the global area. The delay time in the global area is regarded as variable in a range of $\pm\Delta Tg$ with respect to a reference value Tgs. In the present preferred embodiment, a ratio of $\Delta Tg$ to Tgs ($=\Delta Tg/Tgs$) is defined as a global coefficient $\alpha g$. In this case, the maximum value Tgmax in the global area is represented in the form of "Tgs(1+$\alpha g$)", and the minimum value Tgmin in the global area is represented in the form of "Tgs(1−$\alpha g$)".

Under the conditions mentioned above, in the present preferred embodiment, a value reflecting relative variation between the two paths is adopted as the global coefficient $\alpha g$. Between two different points in the mesh section 14, there occurs relative variation in delay time. The degree of relative variation depends on a distance between the two different points. That is, the degree of relative variation decreases with a decrease in the distance therebetween, and the degree of relative variation increases with an increase in the distance therebetween.

Hence, in the present preferred embodiment, an output terminal 13a of the mesh section 14 is identified on a first path, and an output terminal 13b of the mesh section 14 is identified on a second path. Then, a distance Lg between the output terminal 13a and the output terminal 13b is calculated. Further, according to the distance Lg thus calculated, a value of the global coefficient $\alpha g$ is determined. That is, in the present preferred embodiment, as the global coefficient $\alpha g$ indicating variation with respect to the reference value Tgs, there is used a value reflecting relative variation between the two paths. Based on the global coefficient $\alpha g$ thus determined, the maximum value Tgmax and the minimum value Tgmin are calculated to estimate the degree of clock skew.

As mentioned above, since the global coefficient $\alpha g$ is determined according to the distance Lg, it is possible to accurately estimate the degree of clock skew in a case where the mesh section 14 is provided, thereby allowing execution of timing analysis with high accuracy.

Then, the following describes the details of the present preferred embodiment.

Figure 4:
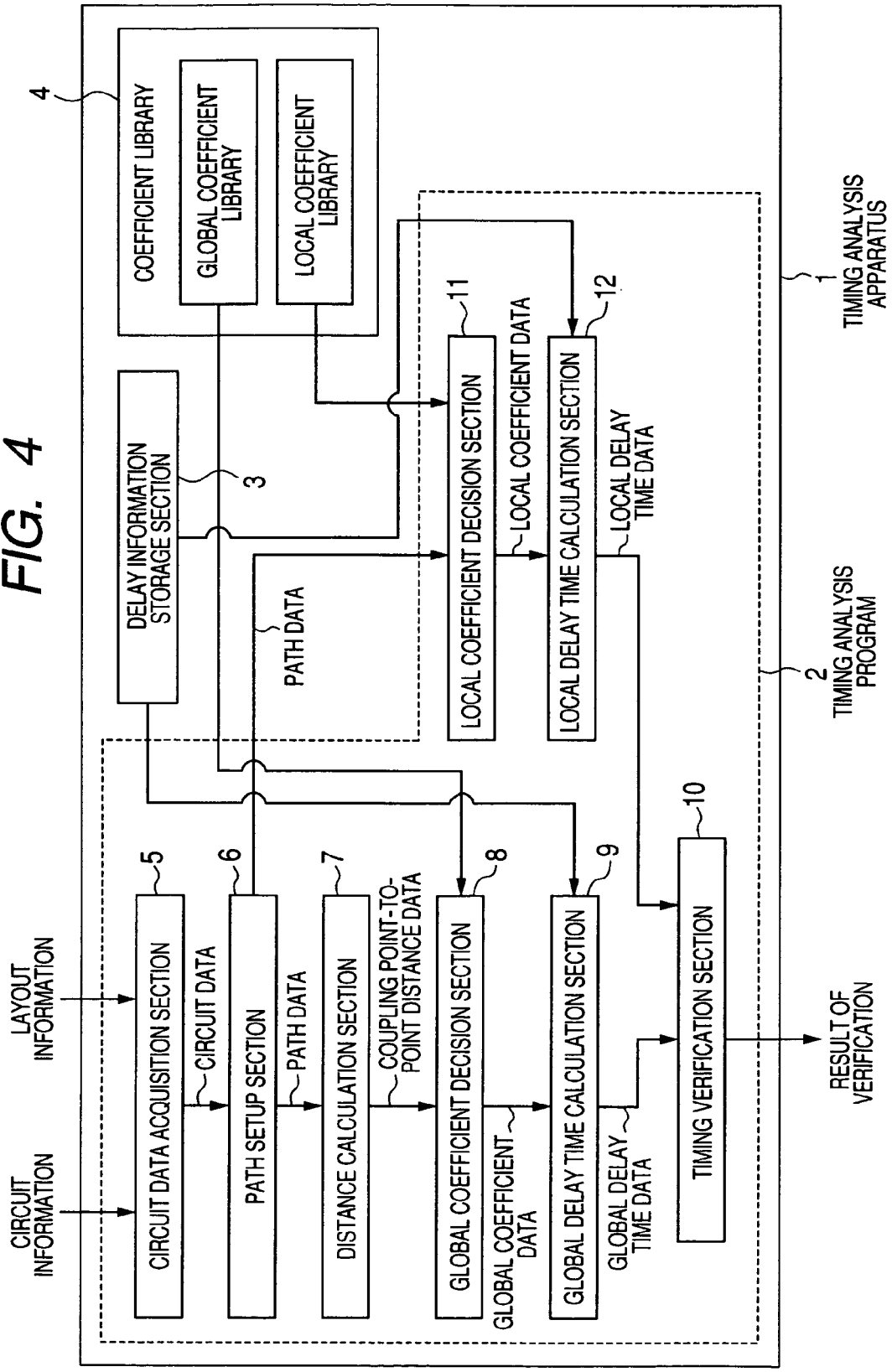
FIG. 4 is a functional block diagram showing a timing analysis apparatus.

Referring to FIG. 4, there is shown a functional block diagram of a timing analysis apparatus 1 according to the present preferred embodiment. The timing analysis apparatus 1 includes a delay information storage section 3, a coefficient library 4, a circuit data acquisition section 5, a path setup section 6, a distance calculation section 7, a global coefficient decision section 8, a global delay time calculation section 9, a timing verification section 10, a local coefficient decision section 11, and a local delay time calculation section 12. The delay information storage section 3 and the coefficient library 4 there among are implemented by a storage medium such as a hard disk unit. In contrast, the circuit data acquisition section 5, the path setup section 6, the distance calculation section 7, the global coefficient decision section 8, the global delay time calculation section 9, the timing verification section 10, the local coefficient decision section 11, and the local delay time calculation section 12 are implemented in the form of a timing analysis program stored in a storage medium such as a read-only memory (ROM) for CPU-controlled execution.

The circuit data acquisition section 5 acquires circuit data regarding a circuit under analysis. More specifically, the circuit data acquisition section 5 acquires circuit data including preliminarily prepared circuit information and layout information. The circuit information pertains to coupling relationships and physical characteristics of device groups included in the circuit under analysis. The layout information pertains to dispositions of the device groups and dispositions of wiring lines for coupling individual devices.

Referring to FIG. 5, there is shown a schematic diagram of an example of a circuit under analysis. The circuit under analysis shown in FIG. 5 includes a clock source IG1, a plurality of drivers IG2 to IG7, a mesh section 14, a plurality of drivers IL1 to IL4, a flip-flop circuit FF1, and a flip-flop circuit FF2. At a stage subordinate to the clock source IG1, the drivers IG2 and IG3 are coupled. At a stage subordinate to the driver IG2, the drivers IG4 and IG5 are coupled. At a stage subordinate to the driver IG3, the drivers IG6 and IG7 are coupled. At a stage subordinate to the drivers IG4 to IG7, the mesh section 14 is coupled for use common thereto. At different positions of the mesh section 14, the drivers IL1 and IL2 are coupled. The driver IL1 is coupled to the flop-flop circuit FF2 via the driver IL3 and the flop-flop circuit FF1. The driver IL2 is coupled to the flip-flop circuit FF2 via the driver IL4.

The path setup section 6 establishes two paths (first path and second path) that are to be subjected to timing analysis based on the circuit data. For example, the path setup section 6 establishes two paths according to path specification information entered by a user through an input apparatus (not shown). In the path setup section 6, path data is produced to indicate the two paths established thereby. In the present preferred embodiment, it is conditioned that the flip-flop circuit FF2 is assigned as a clock supply destination. In establishment of the two paths, a first path from the clock source 1 to the flip-flop circuit FF2 is set up via the mesh section 14, the driver IL2, and the driver IL4. Likewise, a second path from the clock source 1 to the flip-flop circuit FF2 is set up via the mesh section 14, the driver ILL the driver IL3, and the flip-flop circuit FF1.

The distance calculation section 7 identifies a position of the output terminal 13a (first output terminal) of the mesh section 14 corresponding to the first path and a position of the output terminal 13b (second output terminal) of the mesh section 14 corresponding to the second path through use of the path data. Then, the distance calculation section 7 calculates a distance between the first output terminal 13a and the second output terminal 13b as a coupling point-to-point distance Lg. In the distance calculation section 7, coupling point-to-point distance data is produced to indicate each coupling point-to-point distance Lg calculated thereby.

The global coefficient decision section 8 determines a global coefficient $\alpha g$. More specifically, according to the coupling point-to-point distance data, a global coefficient $\alpha g$ is determined by the global coefficient decision section 8. In the global coefficient decision section 8, global coefficient data is produced to indicate each global coefficient αg determined thereby. In this step of operation, the global coefficient decision section 8 determines each global coefficient αg through reference to the coefficient library 4. Data stored in the coefficient library 4 is described below.

Referring to FIG. 6, there is shown a conceptual diagram of data stored in the coefficient library 4. As shown in FIG. 6, the coefficient library 4 includes a global coefficient library and a local coefficient library. The global coefficient decision section 8 makes reference to the global coefficient library to determine each global coefficient αg. Then, the global coefficient library is described here.

The global coefficient library presents a correspondence relationship of coupling point-to-point distances Ln, the numbers of stages, and global coefficients αg as shown in FIG. 6. As described in the foregoing, even in a case where the mesh section 14 is provided, there occurs relative variation in delay time between two paths in the global area. The degree of relative variation in delay time in the global area depends on a distance between the output terminals concerned. That is, the degree of relative variation in delay time decreases with a decrease in the distance between the output terminals. Hence, in the global coefficient library, each global coefficient αg is determined according to the coupling point-to-point distance concerned. Furthermore, the degree of relative variation in delay time may also be dependent on the number of drivers (the number of stages) disposed between the clock source and the mesh section 14. On this account, each global coefficient αg is set up in association with the number of stages.

The global coefficient library is prepared by preliminarily determining experimental data, for example.

The global delay time calculation section 9 calculates a global delay time on each of the first path and the second path according to the global coefficient data. Hereinafter, a global delay time on the first path is referred to as a first global delay time, and a global delay time on the second path is referred to as a second global delay time. More specifically, as the first global delay time, a maximum value Tgmax-1 of delay time on the first path in the global area is calculated. Likewise, as the second global delay time, a minimum value Tgmin-2 of delay time on the second path in the global area is calculated. In the global delay time calculation section 9, global delay time data is produced to indicate global delay time values (Tgmax-1 and Tgmin-2).

In more detailed terms, the global delay time calculation section 9 acquires a reference value Tgs of each path through reference to the delay information storage section 3. Then, in the global delay time calculation section 9, a global delay time is calculated by using the reference value Tgs thus acquired and the global coefficient αg.

Data stored in the delay information storage section 3 is described here. Referring to FIG. 7, there is shown a conceptual diagram of data stored in the delay information storage section 3. As shown in FIG. 7, the delay information storage section 3 contains global delay information and local delay information. The global delay time calculation section 9 calculates a global delay time according to the global delay information. Then, the following describes the global delay information.

As shown in FIG. 7, the global delay information presents a correspondence relationship between output terminal positions of the mesh section 14 and global reference values Tgs. Each global reference value Tgs is predetermined according to such factors as the distance from the clock source IG1 to the output terminal concerned of the mesh section 14 and the number of drivers (the number of stages) disposed between the clock source IG1 and the mesh section 14.

That is, by referencing the global delay information, the global delay time calculation section 9 acquires a global reference value "Tgs-1" corresponding to the first path. Then, in the global delay time calculation section 9, the global reference value "Tgs-1" thus acquired is multiplied by "1+αg". In this manner, the first global delay time Tgmax-1 is calculated. Likewise, a global reference value "Tgs-2" corresponding to the second path is multiplied by "1-αg". Thus, the second global delay time Tgmin-2 is calculated.

The local coefficient decision section 11 is provided with a function for determining a local coefficient αl. More specifically, according to the path data, a local coefficient αl is determined by the local coefficient decision section 11. The term "local coefficient" as used herein indicates a value of deviation in delay time in the local area with respect to the reference value concerned. The local coefficient decision section 11 makes reference to the local coefficient library to determine each local coefficient αl. Then, the local coefficient library is described below.

As shown in FIG. 6, the local coefficient library presents a correspondence relationship between diagonal distances and local coefficients αl. In the local area, a rectangular frame is drawn to cover all the drivers included in the two paths concerned as shown in FIG. 5. Thus, a dimensional value of the diagonal line of the rectangular frame is indicated as a diagonal distance. The degree of relative variation between the two paths in the local area depends on the diagonal distance of the rectangular frame concerned. The local coefficient library is prepared by preliminarily acquiring experimental data, for example.

That is, the local coefficient decision section 11 figures out a diagonal distance of the rectangular frame concerned according to the path data. Then, through reference to the local coefficient library, the local coefficient decision section 11 determines a local coefficient αl that corresponds to the diagonal distance thus figured out.

In the local coefficient decision section 11, local coefficient data is produced to indicate each local coefficient αl determined thereby.

The local delay time calculation section 12 calculates a local delay time on each of the first path and the second path according to the local coefficient data. Hereinafter, a local delay time on the first path is referred to as a first local delay time, and a local delay time on the second path is referred to as a second local delay time. More specifically, as the first local delay time, a maximum value Tlmax-1 of delay time on the first path in the local area is calculated by the local delay time calculation section 12. Likewise, as the second local delay time, a minimum value Tlmin-2 on the second path in the local area is calculated.

In more detailed terms, the local delay time calculation section 12 calculates a local delay time through reference to the local delay information stored in the delay information storage section 3. Then, the following describes the local delay information.

As shown in FIG. 7, the local delay information presents a correspondence relationship of distances L-n, the numbers of stages, and reference values Tls (local reference values). Each distance L-n indicates a path distance between the output terminal concerned of the mesh section 14 and the clock supply destination. The number of stages indicates the number of drivers disposed between the output terminal of the mesh section 14 and the clock supply destination. Each local reference value Tls indicates a reference value of delay time in the local area.

That is, by referencing the local delay information, the local delay time calculation section 12 acquires a local reference value Tls corresponding to each path. Then, in the local delay time calculation section 12, a local reference value "Tls-1" corresponding to the first path is multiplied by "1+αl". In this manner, the first local delay time Tlmax-1 is calculated. Likewise, a local reference value "Tls-2" corresponding to the second path is multiplied by "1−αl". Thus, the second local delay time Tlmin-2 is calculated.

According to the global delay time data and local delay time data, the timing verification section 10 analyses the timing of a clock signal that is fed to the clock supply destination. More specifically, based on the first global delay time Tgmax-1 and the first local delay time Tlmax-1, a maximum value Ttmax-1 of delay time on the entire first path is determined. Likewise, based on the second global delay time Tgmin-2 and the second local delay time Tlmin-2, a minimum value Ttmin-1 of delay time on the entire second path is determined. Then, the difference between the maximum value of delay time on the entire first path and the minimum value of delay time on the entire second path "(Tgmax-1)−(Tlmin-2)" is determined as a value representing the degree of clock skew. The clock skew value thus determined is verified by the timing verification section 10, and the result of verification is output therefrom.

Figure 8:
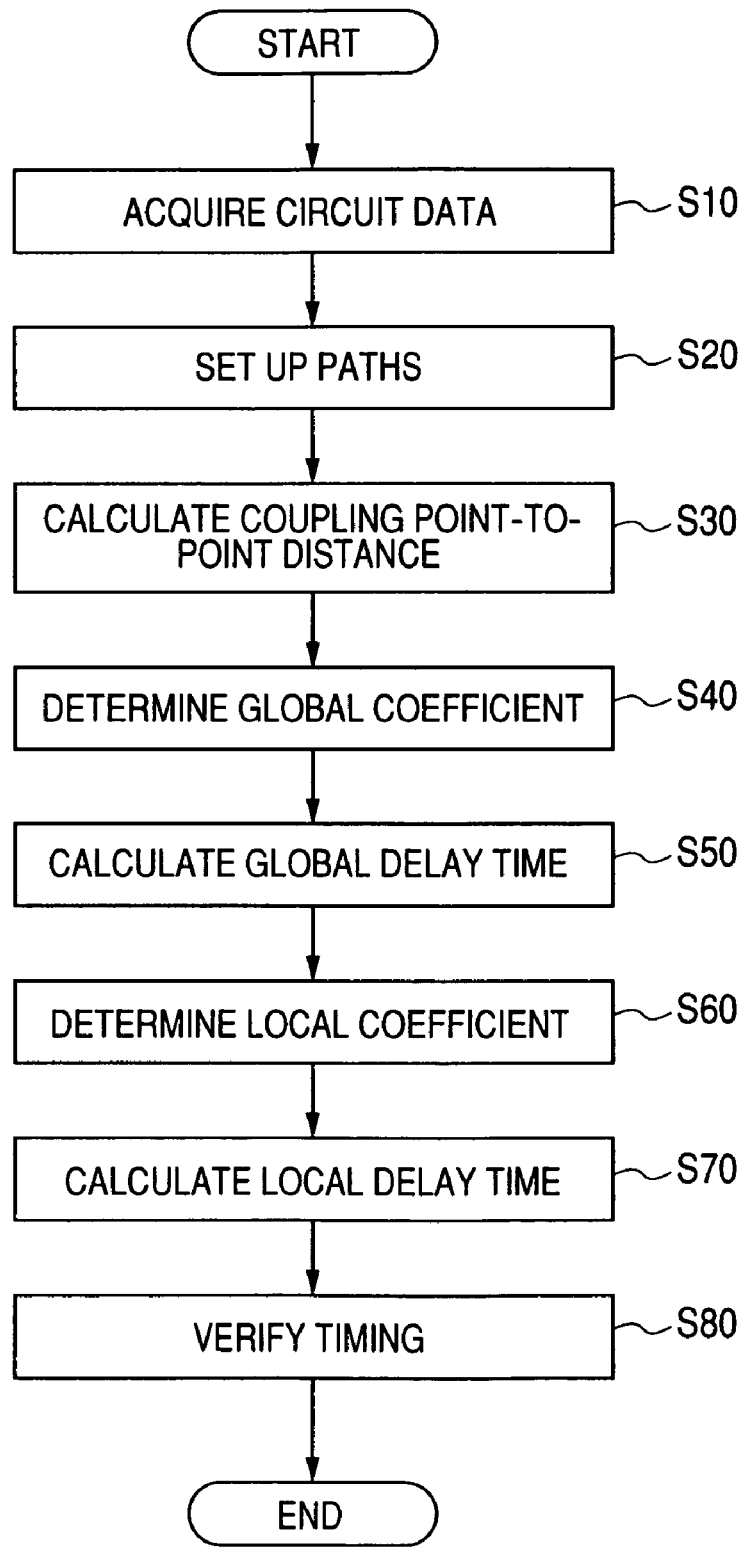
FIG. 8 is a flowchart showing clock timing analysis procedural steps.

Then, the following describes a method for operating the timing analysis apparatus 1 described above. Referring to FIG. 8, there is shown a flowchart of clock timing analysis procedural steps according to the present preferred embodiment. Step S10; Acquisition of circuit data:

First, the circuit data acquisition section 5 acquires circuit data regarding a circuit under analysis. Step S20; Path setup:

Then, the path setup section 6 establishes two paths (first path and second path) to be subjected to timing analysis. More specifically, the path setup section 6 determines a clock supply destination. Then, two paths from the clock source IG1 to the clock supply destination are set up.
Step S30; Coupling Point-to-Point Distance Calculation:

Then, the distance calculation section 7 calculates a coupling point-to-point distance Lg according to path data. In the distance calculation section 7, coupling point-to-point distance data is produced to indicate the coupling point-to-point distance Lg thus calculated.
Step S40; Global Coefficient Determination:

Then, the global coefficient decision section 8 determines a global coefficient αg according to the coupling point-to-point distance data. In determination of a global coefficient αg, the global coefficient decision section 8 makes reference to the coefficient library 4. That is, a global coefficient αg corresponding to the coupling point-to-point distance Lg is determined by the global coefficient decision section 8. In the global coefficient decision section 8, global coefficient data is produced to indicate the global coefficient αg thus determined.
Step S50; Global Delay Time Calculation:

Then, the global delay time calculation section 9 calculates a global delay time according to the global coefficient data. More specifically, the global delay time calculation section 9 calculates a first global delay time Tgmax-1 regarding the first path and a second global delay time Tgmin-2 regarding the second path.
Step S60; Local Coefficient Determination:

Then, the local coefficient decision section 11 determines a local coefficient αl according to the path data. In determination of a local coefficient αl, the local coefficient decision section 11 makes reference to the local coefficient library included in the coefficient library 4.

That is, according to the path data, the local coefficient decision section 11 figures out a diagonal distance of the rectangular frame concerned. Then, through reference to the local coefficient library, the local coefficient decision section 11 determines a local coefficient αl that corresponds to the diagonal distance thus figured out. In the local coefficient decision section 11, local coefficient data is produced to indicate each local coefficient αl determined thereby.
Step S70; Local Delay Time Calculation:

Then, the local delay time calculation section 12 calculates a local delay time according the local coefficient data. More specifically, the local delay time calculation section 12 calculates a first local delay time regarding the first path and a second local delay time regarding the second path.
Step S80; Timing Verification:

Then, according to the global delay time data and local delay time data, the timing verification section 10 analyses the timing of a clock signal that is fed to the clock supply destination. The result of verification is output from the timing verification section 10.

In the present preferred embodiment described above, according to a distance between the first output terminal 13a and the second output terminal 13b of the mesh section 14, a global coefficient is determined to indicate the degree of variation in delay time in the global area. Then, according to the global coefficient thud determined, the degree of clock skew between the first path and the second path is determined. Even in a case where the mesh section 14 is provided, a proper value indicating the degree of variation in delay time in the global area can be adopted, thereby making it possible to accurately estimate the degree of clock skew.

Figure 9:
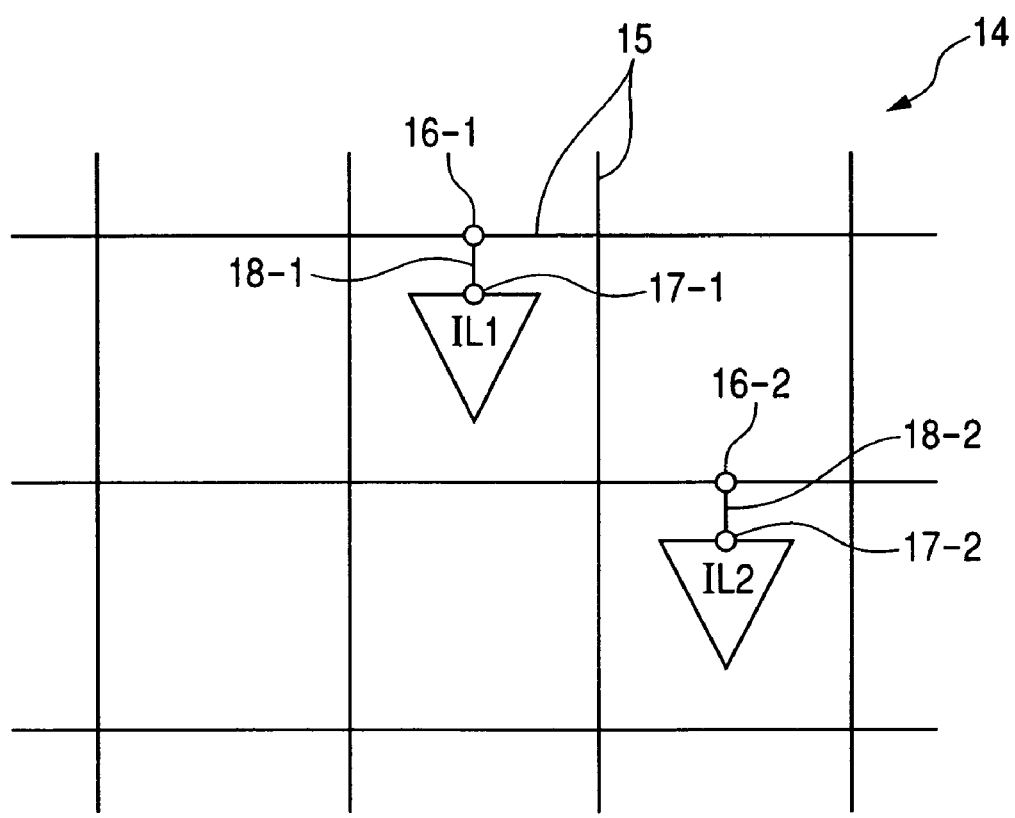
FIG. 9 is a schematic diagram showing an exemplary configuration of the mesh section.

In the present preferred embodiment, the distance calculation section 7 identifies each of the positions of the first output terminal 13a and the second output terminal 13b of the mesh section 14. Then, the following describes a technique for identifying the positions of these output terminals of the mesh section 14. Referring to FIG. 9, there is shown a schematic diagram of an exemplary configuration of the mesh section 14. As shown in FIG. 9, the mesh section 14 has bus wiring 15 arranged in a meshed form. In the exemplary configuration illustrated in FIG. 9, two drivers IL1 and IL2 are coupled to the bus wiring 15. An input terminal 17-1 of the driver IL1 is coupled to an output terminal 16-1 of the bus wiring 15 through a wiring line 18-1, and an input terminal 17-1 of the driver IL2 is coupled to an output terminal 16-2 of the bus wiring 15 through a wiring line 18-2. In determination of a coupling point-to-point distance Lg, as output terminals of the mesh section 14, the input terminals 17 (17-1 and 17-2) of the respective drivers may be used or the output terminals 16 (16-1 and 16-2) of the bus wiring 15 may be used. From the viewpoint of accurately estimating the degree of variation in delay time in the mesh section 14, it is preferable to define the bus wiring 15 exclusively as the mesh section 14. That is, it is preferable to use the output terminals 16 (16-1 and 16-2) of the bus wiring 15 as the output terminals of the mesh section 14. However, in terms of data structure, the positions of the output terminals 16 (16-1 and 16-2) cannot be identified with ease in many cases. Further, the degree of variation in delay time due to wiring 17 (17-1 and 17-2) is sufficiently small in most instances. Hence, the input terminals 17 (17-1 and 17-2) may be defined as the output terminals of the mesh circuit 14. Since the positions of the input terminals 17 of the respective drivers can be identified relatively with ease in terms of data structure, the use of the input terminals 17 thereof makes it possible to reduce computational load in determination of a coupling point-to-point distance.

Further, in the present preferred embodiment, the arithmetic expression "Global reference value×(1+αg)" is used for calculation of the first global delay time (a maximum value of arrival time of a clock signal at the first output terminal 13a) as described above. That is, it is conditioned that the global reference value indicates a center value of delay time at the first output terminal 13a. Note, however, that a value other than the center value (e.g., a minimum value of delay time) may be adopted as the global reference value. A value of global coefficient αg is determined depending on the global reference value adopted in each case. The same principle is applied regarding the second global delay time, the first local delay time, and the second local delay time.

Then, the following describes an operative example of the present preferred embodiment for further detailed explanation thereof. In the operative example given below, SETUP timing analysis is carried out.

Figure 10:
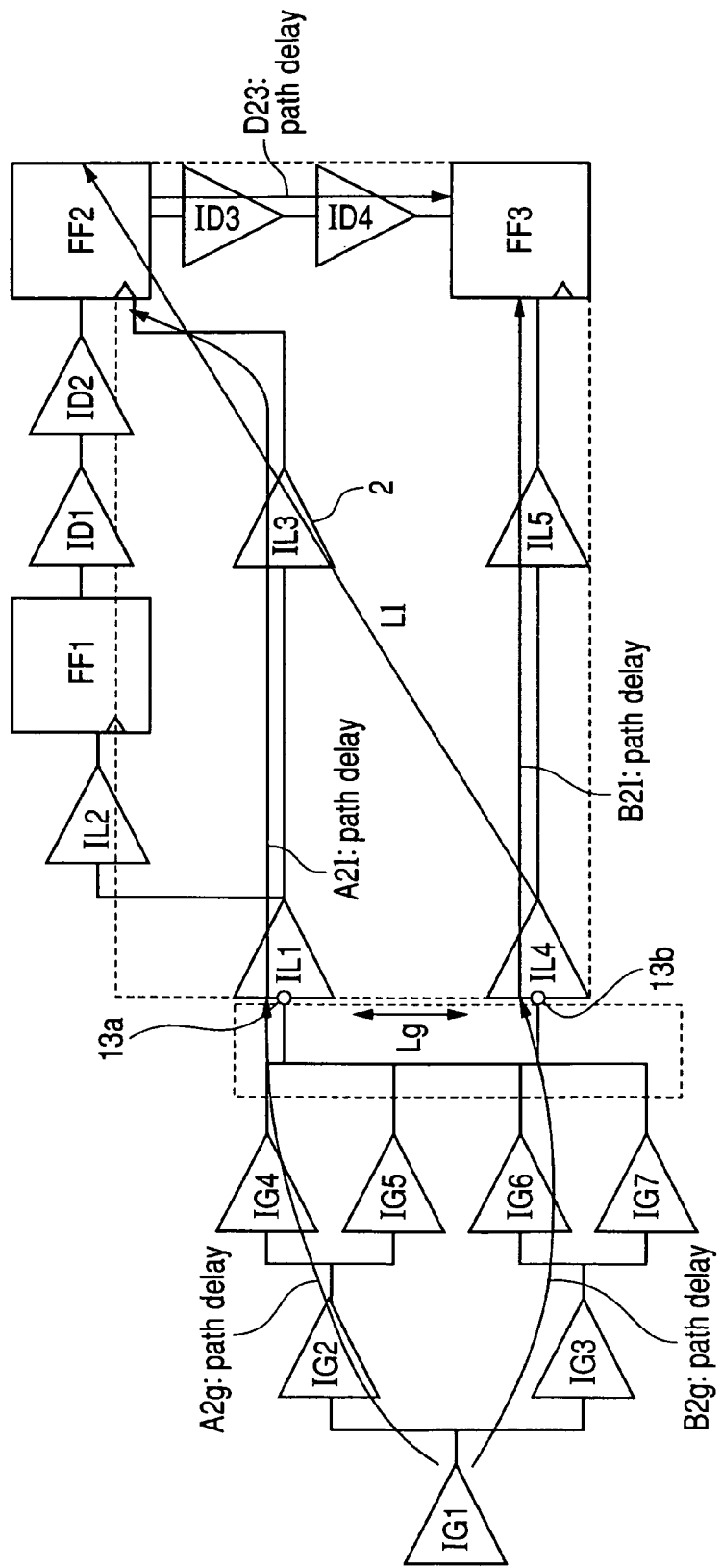
FIG. 10 is a schematic diagram showing a circuit under analysis in an operative example of the preferred embodiment.

In step S10, the circuit data acquisition section 5 acquires circuit data regarding a circuit under analysis. Referring to FIG. 10, there is shown a schematic diagram of the circuit under analysis in the present operative example. That is, it is assumed here that the circuit data acquisition section 5 acquires circuit data shown in FIG. 10. As illustrated in FIG. 10, the circuit under analysis comprises a clock source IG1, a plurality of drivers IG2 to IG7, a mesh section 14, a plurality of drivers IL1 to IL5, a plurality of drivers ID1 to ID4, and a plurality of flip-flop circuits FF1 to FF3. The drivers IG2 to IG7 are disposed between the clock source IG1 and the mesh section 14. The drivers IL1 to IL5, the drivers ID1 to ID4, and the flip-flop circuits FF1 to FF3 are coupled at stages subordinate to the mesh section 14.

In step S20, the path setup section 6 determines the flip-flop circuit FF3 as a clock supply destination. Then, as a first path (launch path), there is established a path from the clock source IG1 to the FF3 via the mesh section 14, the drivers IL1 and IL3, the flip-flop circuit FF2, and the drivers ID3 and ID4. Further, as a second path (capture path), there is established a path from the clock source IG1 to the flip-flop circuit FF3 via the drivers IL4 and IL5.

In step S30, the distance calculation section 7 calculates a coupling point-to-point distance Lg between a first output terminal 13a and a second output terminal 13b.

In step S40, the global coefficient decision section 8 determines a global coefficient αg.

In step S50, the global delay time calculation section 9 calculates a global delay time. Here, a global reference value Tgs-1 on the launch path (a global reference value corresponding to the first output terminal 13a) is assumed to be A2g. Further, a global reference value Tgs-2 on the capture path (a global reference value corresponding to the second output terminal 13b) is assumed to be B2g. Under these conditions, the global delay time calculation section 9 calculates a first global delay time represented by the arithmetic expression "Ag2×(1+αg)", and a second global delay time represented by the arithmetic expression "Bg2×(1−αg)".

In step S60, the local coefficient decision section 11 determines a local coefficient αl regarding each of the launch path and the capture path. In this operation, as shown in FIG. 10, the local coefficient decision section 11 identifies a rectangular frame including the IL1, IL3, FF2, ID3, ID4, IL4, IL5, and FF3. Then, a diagonal distance, i.e., a length Ll of the diagonal line of the rectangular frame is determined. In determination of a local coefficient αl regarding each path, a value corresponding to the length Ll is adopted. Further, the local coefficient decision section 11 determines the number of stages on each path. In determination of a local coefficient αl regarding each path, a value corresponding to the number of stages is also adopted. In the operative example shown in FIG. 10, the number of stages on the launch path in the local area is "5". Hence, a value αl (Ll, 5) corresponding to Ll and the number of stages (5) is adopted as a local coefficient regarding the launch path. Likewise, the number of stages on the capture path is "2". Hence, a value αl (Ll, 2) corresponding to Ll and the number of stages (2) is adopted as a local coefficient regarding the capture path.

In step S70, the local delay time calculation section 12 calculates a local delay time. Here, a local reference value (Tls-1) on the launch path is assumed to be "A2l+D23". Further, a local reference value Tls-2 on the capture path is assumed to be "B2l". Under these conditions, the local delay time calculation section 12 calculates a first local delay time represented by the arithmetic expression "(A2l+D23)×(1+α(Ll, 5))", and a second local delay time represented by the arithmetic expression "B2l×(1+α(Ll, 2))".

In step S80, the timing verification section 10 calculates a maximum delay time on the launch path and a minimum delay time on the capture path. The maximum delay time on the launch path is determined as the sum of the first global delay time and the first local delay time. Likewise, the minimum delay time on the capture path is determined as the sum of the second global delay time and the second local delay time. Based on the maximum delay time and the minimum delay time thus determined, the timing verification section 10 estimates the degree of clock skew between the launch path and the capture path for click skew verification.

It is to be noted that the reference value Tgs of delay time in the global area may be set up for each of a portion including the drivers concerned and a portion including the wringing concerned for device coupling. In this case, the global coefficient αg may also be set up for each of the portion including the drivers concerned and the portion including the wiring concerned.

For example, regarding the launch path, the reference value of delay time in the portion including the drivers concerned is assumed to be A2g[IO]. Further, regarding the launch path, the reference value of delay time in the portion including the wiring concerned is assumed to be A2g[IC]. It is also assumed that a value αig is provided as the global coefficient αg corresponding to the portion including the drivers concerned, and that a value αng is provided as the global coefficient αg corresponding to the portion including the wiring concerned. Under these conditions, the maximum delay time on the launch path is calculated from Expression 1 shown below.

$$A2g[IO] \times (1+\alpha ig) + A2g[IC] \times (1+\alpha ng) + (A2l+D23) \times (1+\alpha(Ll,5)) \quad \text{(Expression 1)}$$

Likewise, regarding the capture path, the reference value of delay time in the portion including the drivers concerned is assumed to be B2g[IO]. Further, regarding the launch path, the reference value of delay time in the portion including the wiring concerned is assumed to be B2g[IC]. It is also assumed that a value αig is provided as the global coefficient αg corresponding to the portion including the drivers concerned, and that a value αng is provided as the global coefficient αg corresponding to the portion including the wiring concerned. Under these conditions, the delay time on the entire capture path is calculated from Expression 2 shown below.

$$B2g[IO] \times (1+\alpha ig) + B2g[IC] \times (1+\alpha ng) + B2l \times (1+\alpha(Ll,2)) \quad \text{(Expression 2)}$$

The difference between the delay time on the capture path and the delay time on the launch path is determined by using the above Expressions 1 and 2. Thus, timing verification can be carried out.

While the present invention has been described in detail with respect to the preferred embodiment and the operative example thereof, it is to be understood by those skilled in the art that the present invention is not limited by any of the details of the foregoing description and that various changes and modifications may be made in the present invention without departing from the sprit and scope thereof.

What is claimed is:

1. A timing analysis apparatus comprising:
   a circuit data acquisition section for acquiring circuit data regarding a circuit under analysis; the circuit under analysis being arranged to include a clock source, a mesh section that is coupled to the clock source and configured with wiring in a meshed form, and a clock supply destination that receives a clock signal from the clock source via the mesh section;
   a path setup section for setting up two paths extending from the clock source to the clock supply destination as a first path and a second path in accordance with the circuit data;
   a distance calculation section for calculating a coupling point-to-point distance between a first output terminal of the mesh section on the first path and a second output terminal of the mesh section on the second path;
   a global coefficient decision section for determining a global coefficient that indicates the degree of variation in time period from the moment when the clock signal is issued from the clock source until the moment when the clock signal reaches each output terminal of the mesh section; and
   a timing verification section for verifying clock supply timing at the clock supply destination in accordance with the global coefficient;
   wherein the global coefficient decision section determines the global coefficient in accordance with the coupling point-to-point distance.

2. The timing analysis apparatus according to claim 1, further comprising:
   a global delay time calculation section for calculating a delay time in clock signal propagation from the clock source to the first output terminal and a delay time in clock signal propagation from the clock source to the second output terminal as a first global delay time and a second global delay time respectively in accordance with the global coefficient;
   wherein the timing verification section verifies clock supply timing on each of the first path and the second path in accordance with the first global delay time and the second global delay time.

3. The timing analysis apparatus according to claim 2,
   wherein the global coefficient decision section determines the global coefficient through reference to preset global coefficient data, and
   wherein the global coefficient data is prepared to present a correspondence relationship between each coupling point-to-point distance and each global coefficient.

4. The timing analysis apparatus according to claim 2,
   wherein the global delay time calculation section calculates each of the first global delay time and the second global delay time in accordance with a preset global reference value, and
   wherein the global reference value is specified for each output terminal position of the mesh section.

5. The timing analysis apparatus according to any one of claim 2, further comprising:
   a local coefficient decision section for determining a local coefficient that indicates the degree of variation in time period of clock signal propagation from each output terminal of the mesh section to the clock supply destination; and
   a local delay time calculation section for calculating a time period of clock signal propagation from the first output terminal to the clock supply destination and a time period of clock signal propagation from the second output terminal to the clock supply destination as a first local delay time and a second local delay time respectively in accordance with the local coefficient;
   wherein the timing verification section verifies clock supply timing in accordance with the first local delay time and the second local delay time.

6. The timing analysis apparatus according to claim 2,
   wherein the global delay time calculation section calculates, as the first global delay time and the second global delay time, a maximum value of delay time at the first output terminal and a minimum value of delay time at the second output terminal, respectively.

7. A timing analysis method comprising the steps of:
   acquiring circuit data regarding a circuit under analysis through computer operation; the circuit under analysis being arranged to include a clock source, a mesh section that is coupled to the clock source and configured with wiring in a meshed form, and a clock supply destination that receives a clock signal from the clock source via the mesh section;
   setting up two paths extending from the clock source to the clock supply destination as a first path and a second path in accordance with the circuit data through computer operation;
   calculating a coupling point-to-point distance between a first output terminal of the mesh section on the first path and a second output terminal of the mesh section on the second path through computer operation;
   determining, in accordance with the coupling point-to-point distance through computer operation, a global coefficient that indicates the degree of variation in time period from the moment when the clock signal is issued from the clock source until the moment when the clock signal reaches each output terminal of the mesh section; and
   verifying clock supply timing at the clock supply destination in accordance with the global coefficient through computer operation.

8. The timing analysis method according to claim 7, further comprising the step of:
   calculating a delay time in clock signal propagation from the clock source to the first output terminal and a delay time in clock signal propagation from the clock source to the second output terminal as a first global delay time and a second global delay time respectively in accordance with the global coefficient through computer operation;
   wherein, in the step of verifying clock supply timing, there is included a step of verifying clock supply timing on each of the first path and the second path in accordance with the first global delay time and the second global delay time.

9. The timing analysis method according to claim 8,
   wherein, in the step of determining the global coefficient, there is included a step of determining the global coefficient through reference to preset global coefficient data, and
   wherein the global coefficient data is prepared to present a correspondence relationship between each coupling point-to-point distance and each global coefficient.

10. The timing analysis method according to claim 8,
wherein, in the step of calculating delay time periods as the first global delay time and the second global delay time, there is included a step of calculating each of the first global delay time and the second global delay time in accordance with a preset global delay reference value, and wherein the global delay reference value is specified for each output terminal of the mesh section.

11. The timing analysis method according to claim 8, further comprising the steps of:

determining a local coefficient that indicates the degree of variation in delay time in clock signal propagation from each output terminal of the mesh section to the clock supply destination; and calculating a delay time in clock signal propagation from the first output terminal to the clock supply destination and a delay time in clock signal propagation from the second output terminal to the clock supply destination as a first local delay time and a second local delay time respectively in accordance with the local coefficient;

wherein, in the step of verifying clock supply timing, there is included a step of verifying clock supply timing on each of the first path and the second path in accordance with the first local delay time and the second local delay time.

12. The timing analysis method according to claim 8,
wherein, in the step of calculating delay time periods as the first global delay time and the second global delay time, there is included a step of calculating, as the first global delay time and the second global delay time, a maximum value of delay time at the first output terminal and a minimum value of delay time at the second output terminal, respectively.

13. A computer readable medium storing a timing analysis program causing a computer to implement the timing analysis method according to claim 9.

* * * * *